United States Patent
Park et al.

(10) Patent No.: US 9,461,626 B2
(45) Date of Patent: Oct. 4, 2016

(54) DYNAMIC VOLTAGE ADJUSTMENT OF AN I/O INTERFACE SIGNAL

(71) Applicant: QUALCOMM Incorporated, San Diego, CA (US)

(72) Inventors: Hee Jun Park, San Diego, CA (US); Dexter Tamio Chun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 25 days.

(21) Appl. No.: 14/330,464

(22) Filed: Jul. 14, 2014

(65) Prior Publication Data

US 2016/0013774 A1    Jan. 14, 2016

(51) Int. Cl.
| | |
|---|---|
| H03K 3/012 | (2006.01) |
| H03K 3/011 | (2006.01) |
| G11C 7/10 | (2006.01) |
| G11C 11/4074 | (2006.01) |
| G11C 11/4093 | (2006.01) |

(52) U.S. Cl.
CPC ............. *H03K 3/012* (2013.01); *G11C 7/1057* (2013.01); *G11C 7/1084* (2013.01); *G11C 11/4074* (2013.01); *G11C 11/4093* (2013.01); *H03K 3/011* (2013.01)

(58) Field of Classification Search
CPC .................. G05B 15/02; H01L 43/02; H01L 21/823475; H01L 27/222; H01L 43/08; H01L 43/10; G06F 11/3409; G06F 11/263; G06F 21/78; G06F 3/014
USPC .......................... 327/108, 109, 110, 111, 112
See application file for complete search history.

(56) References Cited

U.S. PATENT DOCUMENTS

| | | | |
|---|---|---|---|
| 6,218,901 B1 | 4/2001 | Lukes et al. | |
| 6,600,346 B1 | 7/2003 | Macaluso | |
| 6,928,559 B1 | 8/2005 | Beard | |
| 7,301,410 B2 | 11/2007 | Rhee et al. | |
| 7,405,594 B1 | 7/2008 | Xu | |
| 8,143,911 B2 | 3/2012 | Wu et al. | |
| 2005/0218871 A1 | 10/2005 | Kang et al. | |
| 2006/0066351 A1 | 3/2006 | Lau | |
| 2006/0072241 A1* | 4/2006 | Feliss | G06F 1/184 360/97.22 |
| 2009/0066371 A1* | 3/2009 | Kim | H03K 19/018578 327/108 |
| 2010/0125436 A1 | 5/2010 | Chase et al. | |
| 2012/0216084 A1* | 8/2012 | Chun | H04L 25/02 714/708 |

FOREIGN PATENT DOCUMENTS

WO    2008076700 A2    6/2008

OTHER PUBLICATIONS

International Search Report and Written Opinion—PCT/US2015/031433—ISA/EPO—Oct. 22, 2015.
Partial International Search Report—PCT/US2015/031433—ISA/EPO—Aug. 26, 2015.

* cited by examiner

*Primary Examiner* — John Poos
(74) *Attorney, Agent, or Firm* — Loza & Loza LLP

(57) ABSTRACT

Techniques for adjusting swing voltage for an I/O interface signal are described herein. In one embodiment, a device comprises an input/output (I/O) interface, and an I/O voltage controller. The I/O voltage controller is configured to determine a frequency or temperature of the I/O interface, and to adjust a swing voltage of the I/O interface based at least in part upon the determined frequency or temperature.

30 Claims, 6 Drawing Sheets

|   | 200 MHz | 400 MHz | 600 MHz | ... | ... | 1600 MHz |
|---|---------|---------|---------|-----|-----|----------|
| 25° C | -200 mV |  |  |  |  | -90 mV |
| 45° C | -180 mV |  |  |  |  |  |
| 65° C |  |  |  |  |  |  |
| 85° C |  |  | -95 mV |  |  |  |
| 105° C | -100 mV |  |  |  |  | -25 mV |

FIG. 3

DYNAMIC VOLTAGE ADJUSTMENT OF AN I/O INTERFACE SIGNAL

BACKGROUND

1. Field

Aspects of the present disclosure relate generally to I/O interfaces, and more particularly, to systems and methods for dynamically adjusting a swing voltage for an I/O interface.

2. Background

An electronic system may comprise a first device and a second device that communicate with each other via one of more signal paths (e.g., one or more board traces, cables, etc.). In this regard, each device may comprise an input/output (I/O) interface for transmitting signals to and receiving signals from the other device over the one or more signal paths. For example, the first device may comprise a system on a chip (SoC), and the second device may comprise a memory device (e.g., dynamic random access memory (DRAM)), a peripheral device (e.g., mouse), a modem, or other type of device.

In an electronic system, I/O interface power may be a large contributor to the overall power consumption of the system. As interface speed and performance requirements increase, the power consumption observed at an I/O interface increases significantly. Accordingly, it is desirable to reduce I/O interface power, especially for a battery-powered system in order to extend the battery life of the system.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a device is described herein. The device comprises an input/output (I/O) interface, and an I/O voltage controller. The I/O voltage controller is configured to determine a frequency or temperature of the I/O interface, and to adjust a swing voltage of the I/O interface based at least in part upon the determined frequency or temperature.

A second aspect relates to a method for swing voltage determination. The method comprises reducing a swing voltage at a transmitter by a predetermined amount, transmitting a signal from the transmitter to a receiver at the reduced swing voltage over a signal path, and determining whether the signal is successfully received by the receiver. The method also comprises determining a swing voltage for the transmitter based at least in part upon the determination whether the signal is successfully received.

A third aspect relates to a device. The device comprises an input/output (I/O) interface, means for determining a frequency or temperature of the I/O interface, and means for adjusting a swing voltage of the I/O interface based at least in part upon the determined frequency or temperature of the I/O interface.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 3 shows an exemplary voltage margin lookup table according to an embodiment of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
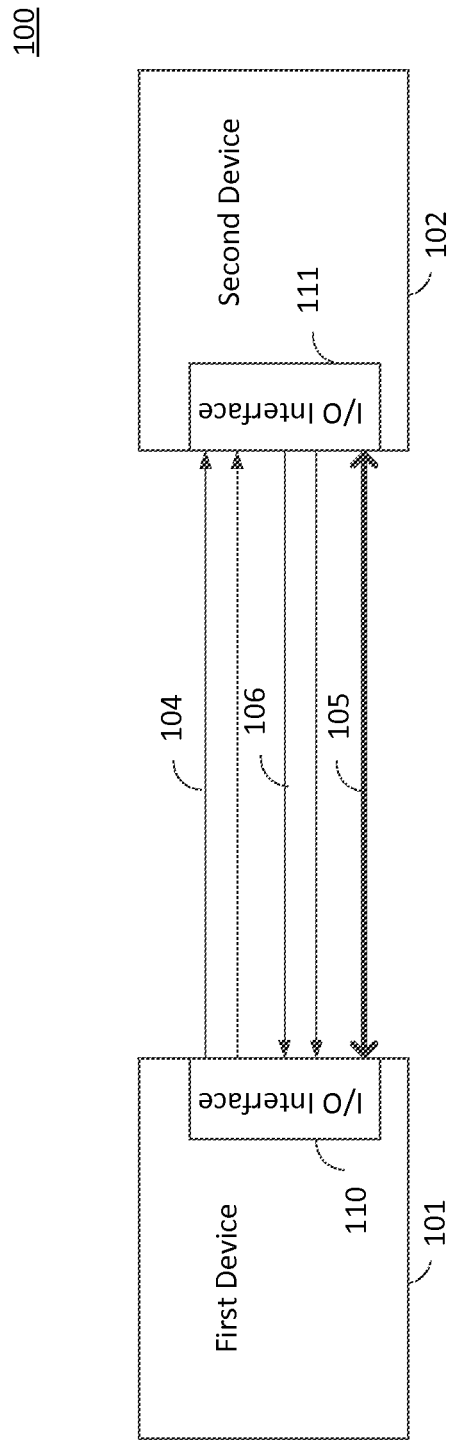
FIG. 1 shows an example of an electronic system including a first device and a second device.

FIG. 1 shows an example of an electronic system 100 including a first device 101 and a second device 102. The first device 101 includes a first I/O interface 110 and the second device 102 includes a second I/O interface 111. The first and second I/O interfaces 110 and 111 are configured to transfer signals (e.g., data signals, clock signals, etc.) between the first and second devices 101 and 102 over one or more physical signal paths. The signal paths may also be referred to as channels or lanes.

In the example shown in FIG. 1, the first I/O interface 110 transmit signals (e.g., differential data signals) to the second I/O interface 111 over a first signal path (e.g., first differential transmission lines) 104, and the second I/O interface 111 transmits signals (e.g., differential data signals) to the first I/O interface 110 over a second signal path (e.g., second differential transmission lines) 106. In some aspects, control signaling between the first device 101 and second device 102 is carried over control path 105. Although the signal paths 104 and 106 are depicted as differential lines in the example in FIG. 1, it is to be appreciated that embodiments of the present disclosure are not limited to transmission of differential signals between the devices. For example, embodiments of the present disclosure may be applied to single-ended signals, ensemble-ended (tri-coupled or higher order) signals, etc.

Each of the first and second signal paths 104 and 106 may comprise a twisted wire pair, conductors in a coaxial cable or another type of cable, traces on a board (e.g., printed circuit board (PCB)), package connecters, board connectors, or any combination thereof. For example, the first device 101 may comprise a system on a chip (SoC) and the second device 102 may comprise an external memory device (e.g., double data rate synchronous DRAM (DDR SDRAM)). In this example, the SoC and the memory device may be on separate chips mounted on a common board (e.g., PCB), in which the first and second signal paths 104 and 106 comprise traces on the board. In another example, the first device 101 may comprise an SoC and the second device 102 may comprise a peripheral device (e.g., mouse, thumb drive, monitor, etc.). In this example, the SoC may be on a chip mounted on a board, in which the first and second signal paths 104 and 106 comprise traces on the board, a cable, and one or more board connectors connecting the cable to the board.

The first and second devices 101 and 102 may transfer signals over the first and second signal paths 104 and 106 according to any one of a number of different standards, including, but not limited to, a peripheral component interconnect express (PCIe) standard, a universal serial bus (USB) standard, a display serial interface (DSI) standard, a camera serial interface (CSI) standard, a high speed interchip (HSIC) standard, etc.

In some aspects, the first and second devices 101 and 102 may support different data rates, in which the data rate between the devices may be dynamically adjusted (e.g., based on performance needs of one or more of the devices). For example, the first device 101 may comprise an SoC and the second device 102 may comprise an external memory device (e.g., DDR SDRAM). In this example, the SoC may comprise one or more circuits (e.g., a central processing unit (CPU), a graphics processing unit (GPU), etc.) that access the memory device (e.g., DDR SDRAM) via a memory interface on the SoC. The first I/O interface 110 may be part of the memory interface. The circuits on the SoC that access the memory device via the memory interface may be referred to as clients. The memory interface may include a memory controller that manages the flow of data between the clients on the SoC and the memory device through the first I/O interface 110. In this example, the memory controller may dynamically adjust the data rate between the SoC and the memory device based on performance needs of the clients.

In some aspects, the data rate may be adjusted by adjusting the frequency of signals (e.g., data signals) sent between the first and second devices 101 and 102 (e.g., also referred to as frequency scaling). For the example in which the first device 101 is a SoC and the second device 102 is an external memory device (e.g., DDR SDRAM), the signal frequency may be adjusted to any one of a plurality of different frequencies within a frequency range of 200 MHz to 1600 MHZ or another frequency range. The power consumption by the I/O interfaces 110 and 111 increases significantly as the signal frequency increases (data rate increases). In this respect, power consumption by the I/O interfaces 110 and 111 becomes a large contributor to the overall power consumption of the system.

When the first I/O interface 110 transmits a signal (e.g., differential data signal) to the second I/O interface 111 over the first signal path 104, the signal may have a swing voltage. The swing voltage may be approximately equal to the difference between the maximum voltage of the signal and the minimum voltage of the signal. Similarly, when the second I/O interface 111 transmits a signal to the first I/O interface 110 over the second signal path 106, the signal may have a swing voltage. The minimum swing voltage required at the I/O interface of each device to successfully transmit a signal to the other device may depend on many parameters.

Parameters may include characteristics (e.g., frequency responses, impedances, dimensions, etc.) of the signal paths 104 and 106 between the first and second devices 101 and 102. The signal paths 104 and 106 may include board traces (e.g., printed circuit board (PCB) traces), chip package connections (e.g., solder bumps or balls), board connectors, cables, or any combination thereof. The characteristics of the signal paths 104 and 106 may vary from system to system (even for systems having the same design) due to manufacturing variation. Other parameters may include characteristics (e.g., threshold voltages, dimensions, etc.) of electronic components (e.g., transistors, resistors, etc.) in the I/O interfaces 110 and 111, which may vary from system to system due to process variation. Thus, the minimum required signal swing voltage may vary from system to system.

Additional parameters may include parameters that dynamically change during operation of the system. These parameters may include temperature and signal frequency (e.g., data transfer rate). Thus, the minimum required signal swing voltage may dynamically change due to changes in the operating condition of the system.

In a conventional approach, the signal swing voltage is fixed at a predetermined voltage based on worst-case scenarios for parameters affecting the minimum required signal swing voltage. For example, the signal swing voltage may be fixed at 1.1 V for DDR signals. However, it is unlikely that a particular system will experience the worst-case for all of these parameters. As a result, in the majority of systems, the signal swing voltage is fixed at a predetermined voltage that is higher than necessary for reliable communication between the devices, resulting in power waste.

Embodiments of the present disclosure reduce I/O power consumption by dynamically adjusting the signal swing voltage of an I/O interface, as discussed further below.

Figure 2:
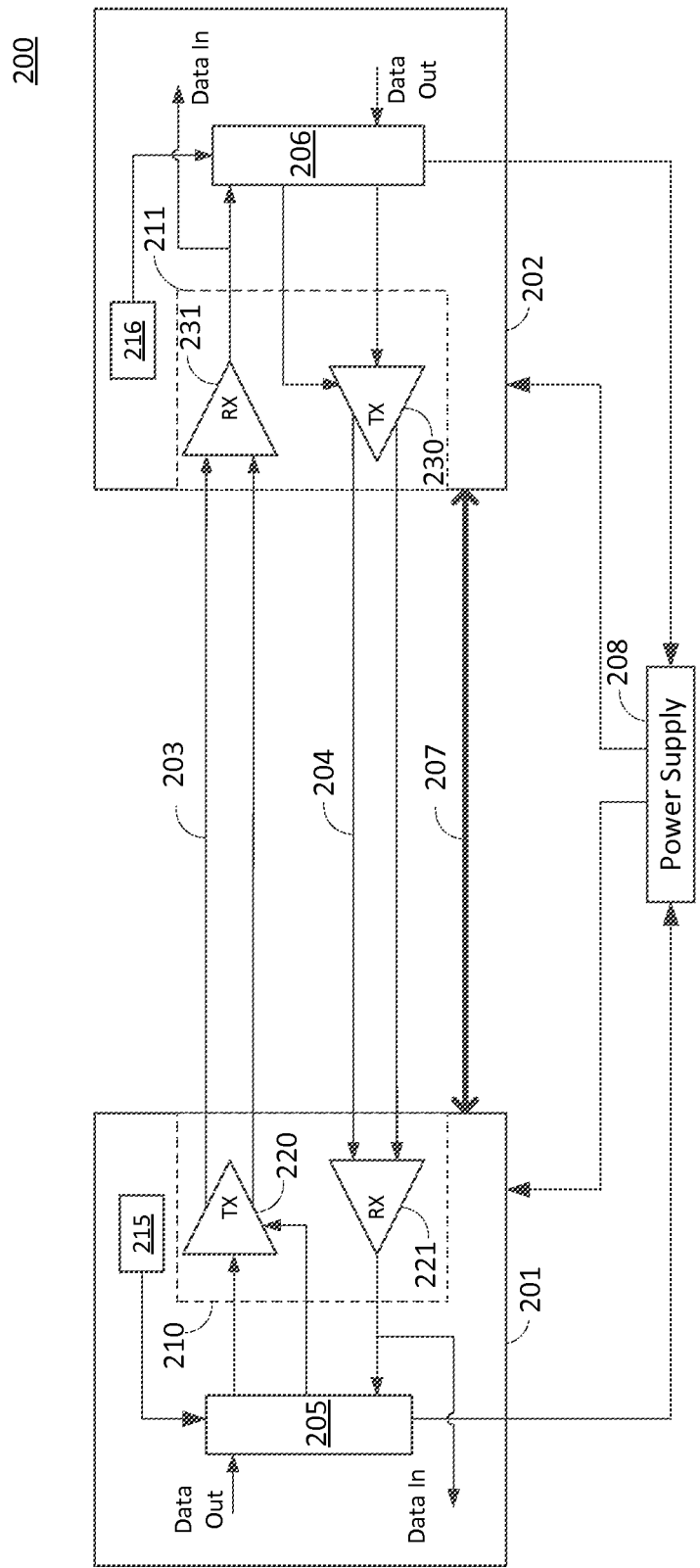
FIG. 2 shows an example of an electronic system with dynamic swing voltage adjustment according to an embodiment of the present disclosure.

FIG. 2 shows an example of an electronic system 200 according to an embodiment of the present disclosure. The electronic system 200 includes a first device 201, a second device 202, a first signal path (e.g., first differential transmission lines) 203, and a second signal path (e.g., second differential transmission lines) 204. The first device 201 comprises a first I/O interface 210, and the second device 202 comprises a second I/O interface 211. The first and second I/O interfaces 210 and 211 are configured to transfer signals (e.g., data signals, clock signals, etc.) between the first and second devices 201 and 202 over the signal paths 203 and 204, as discussed further below. In some aspects, control signaling between the first device 201 and second device 202 is carried over control path 207.

The first I/O interface 210 comprises a first transmitter 220 and a first receiver 221, and the second I/O interface 211 comprises a second transmitter 230 and a second receiver 231. The first transmitter 220 is configured to transmit signals (e.g., data signals) over the first signal path 203, and the second receiver 231 is configured to receive the signals transmitted by the first transmitter 220. Thus, the first transmitter 220 and the second receiver 231 facilitate communication from the first device 201 to the second device 202 over the first signal path 203. Similarly, the second transmitter 230 is configured to transmit signals (e.g., data signals) over the second signal path 204, and the first receiver 221 is configured to receive the signals transmitted by the second transmitter 230. Thus, the second transmitter 230 and the first receiver 221 facilitate communication from the second device 202 to the first device 201 over the second signal path 204.

For the example in which the first device 201 comprises an SoC and the second device 202 comprises an external memory device (e.g., DDR SDRAM), the first transmitter 220 may transmit data from a client (e.g., CPU) on the SoC to the external memory device over the first signal path 203. The second receiver 231 on the memory device receives the data and forwards the received data to memory logic (not shown) that writes the data into memory. The second transmitter 230 may receive data read from memory in the memory device in response to a read command from the SoC, and transmit the data to the SoC over the second signal path 204. The first receiver 221 on the SoC receives the data, and forwards the received data to the memory controller (not shown), which routes the data to the intended client (e.g., CPU).

The first device 201 also comprises a first I/O voltage controller 205, and a first temperature sensor 215. The first I/O voltage controller 205 is configured to dynamically adjust the output swing voltage of the first transmitter 220, as discussed further below. The first temperature sensor 215 is configured to sense a temperature of the first I/O interface 210, and report the sensed temperature to the first I/O voltage controller 205. In this regard, the first temperature sensor 215 may be located near or within the first I/O interface 210. The first I/O voltage controller 205, the first I/O interface 210, and the first temperature sensor 215 may be integrated on the same chip.

The second device 202 also comprises a second I/O voltage controller 206, and a second temperature sensor 216. The second I/O voltage controller 206 is configured to dynamically adjust the output swing voltage of the second transmitter 230, as discussed further below. The second temperature sensor 216 is configured to sense a temperature of the second I/O interface 211, and report the sensed temperature to the second I/O voltage controller 206. In this regard, the second temperature sensor 216 may be located near or within the second I/O interface 211. The second I/O voltage controller 206, the second I/O interface 211, and the second temperature sensor 216 may be integrated on the same chip.

The system 200 may also comprise a power supply 208. The power supply 208 may provide one or more supply voltages to the I/O interfaces 210 and 211 for powering the I/O interfaces 210 and 211. In some aspects, the power supply 208 may be an adjustable power supply, in which the one or more supply voltages may be adjusted under the control of the first I/O voltage controller 205 and/or the second I/O voltage controller 206, as discussed further below.

In some aspects, the first I/O voltage controller 205 may be configured to determine the frequency and temperature of the first I/O interface 210. For the example in which the second device 202 is a memory device (e.g., DDR SDRAM), the first I/O voltage controller 205 may receive an indication of the frequency (data rate) from a memory controller (not shown) that controls the frequency. The first I/O voltage controller 205 may determine the temperature based on a temperature reading from the first temperature sensor 215.

The first I/O voltage controller 205 may then determine a signal swing voltage margin corresponding to the determined frequency and temperature. The swing voltage margin may represent a reduction in the swing voltage of the transmitter 220 from a swing voltage defined in a specification, in which the signal swing voltage defined in the specification may be based on worst-case scenarios. For example, if the swing voltage margin is −200 mV and the swing voltage in the specification is 1.1 V, then the swing voltage of the transmitter 220 may be set to 900 mV. The signal swing voltage margin may be determined for a particular frequency and temperature by performing a voltage margin sensing procedure between first and second devices 201 and 202, as discussed below.

In one embodiment, the voltage margin sensing procedure comprises (1) reducing the swing voltage of the transmitter 220 by a predetermined amount, (2) transmitting a predetermined data pattern from the transmitter 220 to the receiver 231 of the second device 202 over the first signal path 203, and (3) comparing the predetermined data pattern received by the second device with a local copy of the predetermined data pattern at the second device. Steps (1) through (3) may be repeated until the received data pattern does not match the predetermined data pattern. When the received data pattern no longer matches the predetermined data pattern, the voltage margin may be determined based on the lowest swing voltage at which the patterns matched.

The voltage margin sensing procedure may be performed at each one of a plurality of different temperatures and frequencies to obtain a swing voltage margin for each temperature-frequency pair. The swing voltage margins may be entered into a lookup table 300, an example of which is shown in FIG. 3. In this example, at a temperature of 25° C. and a frequency of 200 MHz, the swing voltage margin is −200 mV, meaning that the swing voltage can be set to a value that is 200 mV less than the signal swing voltage defined in the specification. If the swing voltage in the specification is 1.1 V, then the swing voltage is 900 mV (i.e., 1.1 V −200 mV). This results in a substantial reduction in power consumption by the I/O interface 210 compared with the prior approach in which the swing voltage of the first transmitter 220 is fixed at the swing voltage defined in the specification. The lookup table may be stored in non-volatile memory on the first device 201. It is to be appreciated that a determined swing voltage may be entered into the lookup table instead of the corresponding voltage margin. Accordingly, throughout this disclosure, it is to be understood that swing voltages (e.g., 900 mV) may be used in the lookup table.

A method for determining a swing voltage margin for a position in a lookup table (e.g., lookup table 300) will now be described according to an embodiment of the present disclosure. First, the first I/O voltage controller 205 may set transmissions from the first transmitter 220 to a frequency that matches one of the frequencies in the lookup table. The first I/O voltage controller 205 may also determine the temperature of the first I/O interface 210 based on a temperature reading from the first temperature sensor 215.

After the frequency is set and the temperature determined, the first I/O voltage controller 205 may incrementally reduce the swing voltage of the first transmitter 220 by a voltage step starting from the swing voltage in the specification (e.g., 1.1 V). Each time the swing voltage is reduced, the transmitter 220 may transmit a predetermined data pattern to the receiver 231 of the second device 202 over the first signal path 203. Each time the pattern is received by the second device 202 at one of the swing voltages, a determination may be made whether the pattern was successfully received by the second device 202. This determination may be made using any one of a number of different methods.

For example, the second I/O voltage controller 206 at the second device 202 may receive the pattern from the receiver 231, and compare the received pattern against a local copy of the predetermined data pattern. If the received pattern matches the local copy of the pattern, then the second I/O voltage controller 206 may determine that the pattern was successfully received, and, if the received pattern does not match the local copy of the pattern, then the second I/O voltage controller 206 may determine that the pattern was not successfully received. The second I/O voltage controller 206 may then send an indication of whether the pattern was successfully received to the first I/O voltage controller 205. The second I/O voltage controller 206 may transmit the indication over the second signal path 204 using the transmitter 230 of the second device 202. The transmitter 230 may transmit the indication to the first device 201 using a high swing voltage and/or low frequency to ensure that the indication is reliably received by the first device 201. The high swing voltage may be greater than the swing voltage at which the pattern was transmitted from the first device 201. The low frequency may be lower than the frequency at which the pattern was transmitted from the first device 201 to the second device 202.

In another example, the second I/O voltage controller 206 may transmit the received pattern back to the first device 202 over the second signal path 204 using the transmitter 230 of the second device 202. The transmitter 230 may transmit the pattern back to the first device 201 using a high swing voltage and/or low frequency. The high swing voltage may be greater than the swing voltage at which the pattern was transmitted from the first device 201. The low frequency may be lower than the frequency at which the pattern was transmitted from the first device 201 to the second device 202. This ensures that the first device 201 accurately receives the pattern as the pattern was received by the second device 202 and that any discrepancy between the received pattern and the transmitted pattern is due to the transmission from the first device 201 to the second device 202. If the received pattern matches the transmitted pattern, then the first I/O voltage controller 205 may determine that the pattern was successfully received by the second device 202, and, if the received pattern does not match the transmitted pattern, then the first I/O voltage controller 205 may determine that the pattern was not successfully received by the second device 202.

In yet another example, the data pattern transmitted from the first device 201 to the second device 202 may comprise a data portion and an error-detection portion (e.g., parity check bits, cyclic redundancy check bits, etc.) that is calculated from the data portion using an error detecting algorithm. Upon receiving the data pattern, the second I/O voltage controller 206 may recalculate the error-detection portion from the received data portion, and compare the recalculated error-detection portion with the received error-detection portion. If the recalculated error-detection portion matches the received error-detection portion, then the second I/O voltage controller 206 may determine that the pattern was successfully received, and, if the recalculated error-detection portion does not match the received error-detection portion, then the second I/O voltage controller 206 may determine that the pattern was not successfully received. The second I/O voltage controller 206 may then send an indication of whether the pattern was successfully received to the first I/O voltage controller 205.

After transmitting the predetermined data pattern at the different swing voltages, the first I/O voltage controller 205 may determine the lowest one of the swing voltages at which the pattern was successfully received by the second device 202. The first I/O voltage controller 205 may then compute the swing voltage margin based on a difference between the swing voltage in the specification and the lowest swing voltage, and enter the swing voltage margin into the corresponding position in the lookup table. To be more conservative, the first I/O voltage controller 205 may use the second or third lowest swing voltage at which the pattern was successfully received to determine the voltage margin.

In some aspects, the first I/O voltage controller 205 may reduce the swing voltage margin by a small amount before entering the swing voltage margin into the lookup table. This may be done to make the swing voltage margin more conservative.

If the temperature from the temperature sensor 215 does not match a temperature in the lookup table, then the first I/O voltage controller 205 may determine the next lower temperature in the lookup table. For example, using the table 300 in FIG. 3, if the sensed temperature is 48° C., then the next lower temperature in the table 300 is 45° C. In this example, after the first I/O voltage controller 205 determines the swing voltage margin, the first I/O voltage controller 205 may enter the swing voltage margin into the position corresponding to the set frequency and the next lower temperature in the lookup table. Since voltage margin tends to decrease with increasing temperature for a given frequency, a voltage margin determined at a higher temperature should work at a lower temperature.

Thus, the first I/O voltage controller 205 is able to determine a voltage margin for a frequency-temperature pair, in which the voltage margin may represent a reduction in the swing voltage of the transmitter 220 compared with a swing voltage defined in a specification based on worst-case scenarios. The determined voltage margin takes into account static parameters of the first signal path 203 that affect the amount of swing voltage needed for successful transmission from the first device 201 to the second device 202 over the first signal path 203. This is because the voltage margin is determined based on transmissions over the first signal path 203. The static parameters may include frequency responses, impedances, and/or dimensions of the first signal path 203. The first signal path 203 may include traces on a PCB, chip package connections (e.g., solder bumps or balls), board connectors, or any combination thereof. As a result, for non-worst cases (which represent the majority of cases), the determined voltage margin allows the first I/O voltage controller 205 to reduce the swing voltage to reduce power consumption while maintaining reliable communication between the first and second devices 201 and 202.

In some aspects, the voltage margin lookup table may be populated by a manufacturer, in which the manufacturer may apply controlled temperatures for respective operating frequencies to yield corresponding swing voltage margins. For example, the manufacturer may sequentially heat the I/O interface 210 to each one of a plurality of different temperatures (e.g., using a temperature-controlled chamber). At each temperature, the first I/O voltage controller 205 may determine one or more swing voltage margins at one or more different frequencies, and enter the determined swing voltage margins into the lookup table. In some aspects, the I/O voltage controller 205 may populate the voltage margin lookup table when the I/O interface 210 is in an idle state (e.g., no data traffic). It is to be appreciated that the lookup table may be populated with swing voltage margins both by the manufacturer and during idle times.

In some aspects, the lookup table may initially be populated with corner cases, such as swing voltage margin 301 (e.g., at a temperature of 25° C. and a frequency of 200 MHz), swing voltage margin 302 (e.g., at a temperature of 105° C. and a frequency of 200 MHz), swing voltage margin 303 (e.g., at a temperature of 25° C. and a frequency of 1600 MHz), swing voltage margin 304 (e.g., at a temperature of 105° C. and a frequency of 1600 MHz) shown in FIG. 3. In this respect, the voltage margins for remaining positions in the lookup table 300 may be extrapolated and/or interpolated from voltage margins already captured in the lookup table 300. In some aspects, a voltage margin for one of the remaining positions may be subsequently determined using a voltage margin sensing procedure (e.g., during an idle state) according to any of the embodiments discussed above, and the determined voltage margin may replace the corresponding extrapolated or interpolated voltage margin in the table.

During operation, the first I/O voltage controller 205 may sense frequency and/or temperature changes, as discussed above. In response to a frequency and/or temperature change, the first I/O voltage controller 205 may obtain a corresponding swing voltage margin from the lookup table (e.g., lookup table 300). The first I/O voltage controller 205 may then adjust the signal swing voltage of the transmitter 220 based on the voltage margin. For example, if the voltage margin is −200 mV, then the first I/O voltage controller 205 may adjust the signal swing voltage to a voltage that is 200 mV below the signal swing voltage defined in the specification. In addition, the first I/O voltage controller 205 may send control signals to the power supply 208 to adjust one or more supply voltages according to the voltage margin. For example, the transmitter 220 may be powered between two voltage supply rails, and the voltage controller may command the power supply 208 to adjust the supply voltage of one or more of the rails such that the voltage across the two supply rails corresponds to the desired swing voltage. For the example in which the lookup table contains swing voltages, the first I/O voltage controller 205 may retrieve the swing voltage corresponding to the frequency and/or temperature change, and adjust the swing voltage of the transmitter 220 according to the retrieved swing voltage.

In some aspects, the first I/O voltage controller 205 may stall (suspend) data traffic before adjusting the signal swing voltage. While the data traffic is stalled, the first I/O voltage controller 205 may adjust the swing voltage of the transmitter 220. After the voltage adjustment, the first I/O voltage controller 205 may resume the data traffic. This may be done so that the voltage adjustment does not distort the data traffic. The data traffic may be transmitted by the transmitter 220 of the first device 201, and received by the receiver 231 of the second device 202. In FIG. 2, the outgoing data traffic at the first device 201 is denoted "Data Out" and the received data traffic at the second device 202 is denoted "Data In."

In some aspects, the first I/O voltage controller 205 may determine a frequency change in advance (i.e., before the frequency change is implemented). For example, a device that controls the frequency (e.g., memory controller) may send an indication to the first I/O voltage controller 205 that the frequency will be changed to a new frequency. In response, the first I/O voltage controller 205 may obtain a swing voltage margin corresponding to the new frequency and current temperature from the lookup table (e.g., lookup table 300). The first I/O voltage controller 205 may then stall (suspend) data traffic. While the data traffic is stalled, the first I/O voltage controller 205 may adjust the swing voltage of the transmitter 220. In addition, the frequency may be changed to the new frequency and allowed to settle during this time. After the voltage adjustment and frequency change, the first I/O voltage controller 205 may resume the data traffic. Alternatively, the device that controls the frequency may stall data traffic for a period of time in order to change the frequency. While the data traffic is stalled, the first I/O voltage controller 205 may adjust the swing voltage.

In some aspects, when the first I/O voltage controller 205 consults the lookup table (e.g., lookup table 300) to determine a swing voltage margin for a particular frequency and sensed temperature, the lookup table may not have an entry matching the sensed temperature. In this case, the first I/O voltage controller 205 may determine the next higher temperature in the lookup table for which there is an entry at the corresponding frequency, and select the swing voltage margin corresponding to the next higher temperature. For example, using the table 300 in FIG. 3, if the sensed temperature is 40° C. and the frequency is 200 MHz, then the first I/O voltage controller 205 may select the swing voltage margin (e.g., −180 mV) at the temperature of 45° C. (next higher temperature) and frequency of 200 MHz in the table 300. Selecting the swing voltage margin for the next higher temperature is a conservative approach (as opposed to the next lower temperature). This is because swing voltage margin tends to decrease with increasing temperature for a given frequency. As a result, the swing voltage margin corresponding to the next higher temperature should provide a sufficient swing voltage at the sensed temperature.

In some aspects, when the first I/O voltage controller 205 receives a temperature reading from the first temperature sensor 215, the first I/O voltage controller 205 may add a small temperature margin (e.g., two degrees) to the temperature reading, and perform the operations described above based on the temperature reading with the added temperature margin. The small temperature margin may be used to account for any delays in detecting the temperature and/or responding to a change in temperature.

In some aspects, when the first I/O voltage controller 205 detects a change in the temperature, the first I/O voltage controller 205 may determine the magnitude of the change in temperature before determining whether to adjust the swing voltage. For example, the first I/O voltage controller 205 may compute the absolute difference between a new temperature reading from the temperature sensor 215 and an old temperature reading (e.g., temperature reading at the last time the swing voltage was adjusted). The first I/O voltage controller 205 may then compare the absolute difference to a temperature hysteresis value. If the absolute temperature difference is equal to or below the temperature hysteresis value, then the first I/O voltage controller 205 may leave the current swing voltage alone. If the absolute difference is above the temperature hysteresis value, then the first I/O voltage controller 205 may consult the lookup table to determine whether the swing voltage needs to be adjusted based on the new temperature and frequency. More particularly, the first I/O voltage controller 205 may determine the swing voltage margin in the lookup table corresponding to the new temperature and frequency. If the determined swing voltage margin is different from the current swing voltage margin, then the first I/O voltage controller 205 may adjust the swing voltage according to the determined swing voltage margin, as discussed above. Otherwise, the first I/O voltage controller 205 may leave the current swing voltage alone. The temperature hysteresis value may be used to prevent the first I/O voltage controller 205 from constantly changing the swing voltage due to small temperature fluctuations.

In some aspects, when the first I/O voltage controller 205 determines a change in the frequency, the first I/O voltage controller 205 may determine whether the frequency change causes the frequency to cross one or more predetermined frequency boundaries. If the frequency does not cross one of the frequency boundaries, then the first I/O voltage controller 205 may leave the current swing voltage alone. If the frequency crosses at least one of the frequency boundaries, then the first I/O voltage controller 205 may obtain a voltage margin from the lookup table based on the current temperature and frequency change, and adjust the swing voltage based on the obtained voltage margin. The one or more frequency boundaries may be used to prevent the first I/O voltage controller 205 from adjusting the swing voltage when a change in the frequency corresponds to only a small change in the swing voltage margin. In this example, a frequency boundary may be placed between two adjacent frequencies corresponding to swing voltage margins that differ by an amount exceeding a predetermined amount.

It is to be appreciated that the swing voltage of the second transmitter 230 may also be adjusted using any of the techniques discussed above. For example, the second I/O voltage controller 206 may determine a swing voltage margin for a particular frequency and temperature using a voltage margin sensing procedure according to any of the embodiments discussed above. In this regard, the second I/O voltage controller 206 may incrementally reduce the swing voltage at the transmitter 230 by a voltage step. Each time the swing voltage is reduced, the transmitter 230 may transmit a predetermined data pattern to the receiver 221 of the first device 202 over the second signal path 204. Each time the pattern is received by the first device 201 at one of the swing voltages, a determination may be made whether the pattern was successfully received by the first device 201 using any of the techniques discussed above. After transmitting the predetermined data pattern at the different swing voltages, the second I/O voltage controller 206 may determine the lowest one of the swing voltages at which the pattern was successfully received by the first device 201. The second I/O voltage controller 206 may then compute the swing voltage margin based on a difference between the swing voltage in the specification and the lowest swing voltage, and enter the swing voltage margin into a lookup table for the second device 202.

During operation, the second I/O voltage controller 206 may sense frequency and/or temperature changes. For example, the second I/O voltage controller 206 may sense temperature changes based on temperature readings from the second temperature sensor 216. In response to a frequency and/or temperature change, the second I/O voltage controller 206 may obtain a corresponding swing voltage margin from the lookup table for the second device 202. The second I/O voltage controller 206 may then adjust the signal swing voltage of the transmitter 230 based on the voltage margin. In addition, the second I/O voltage controller 206 may send control signals to the power supply 208 to adjust one or more supply voltages according to the voltage margin. Thus, the second I/O voltage controller 206 may dynamically adjust the swing voltage of the transmitter 230 using any of the techniques discussed above for the first I/O voltage controller 205. In other words, swing voltage adjustment is not limited to one direction, and may be applied to signals transmitted in either direction.

It is to be appreciated that the system 200 may comprise a plurality of signal paths (lanes or channels) carrying signals (e.g., data signals) from the first device 201 to the second device 202. In this example, the first device 201 may comprise a plurality of transmitters (one for each signal path). The first I/O voltage controller 205 may individually adjust the swing voltage of each transmitter using any of the techniques discussed above.

Alternatively, the first I/O voltage controller 205 may use the same swing voltage for all of the transmitters. For example, for a particular frequency and temperature, the first I/O voltage controller 205 may determine a corresponding swing voltage margin using the following procedure. First, the first I/O voltage controller 205 may incrementally reduce the swing voltage for all of the transmitters by a voltage step starting from the swing voltage in the specification. Each time the swing voltage is reduced, the transmitters may transmit a predetermined data pattern on each of the signal paths. Each time the pattern is transmitted over the signal paths at one of the swing voltages, a determination may be made whether the pattern was successfully received over each signal path by the second device 202. For example, the second I/O voltage controller 206 may compare the pattern received over each signal path to the predetermined pattern. The second I/O voltage controller 206 may determine that the transmission was successful if the received pattern for each signal path matches the predetermined pattern, and determine that the transmission was unsuccessful if the received pattern for one or more of the signal paths does not match the predetermined pattern. The second I/O voltage controller 206 may then communicate to the first I/O voltage controller 205 whether the transmission was successful. After transmitting the predetermined data pattern at the different swing voltages, the first I/O voltage controller 205 may determine the lowest one of the swing voltages at which the pattern was successfully receiver over all of the signal paths, and determine the voltage margin based on the lowest swing voltage.

Figure 4:
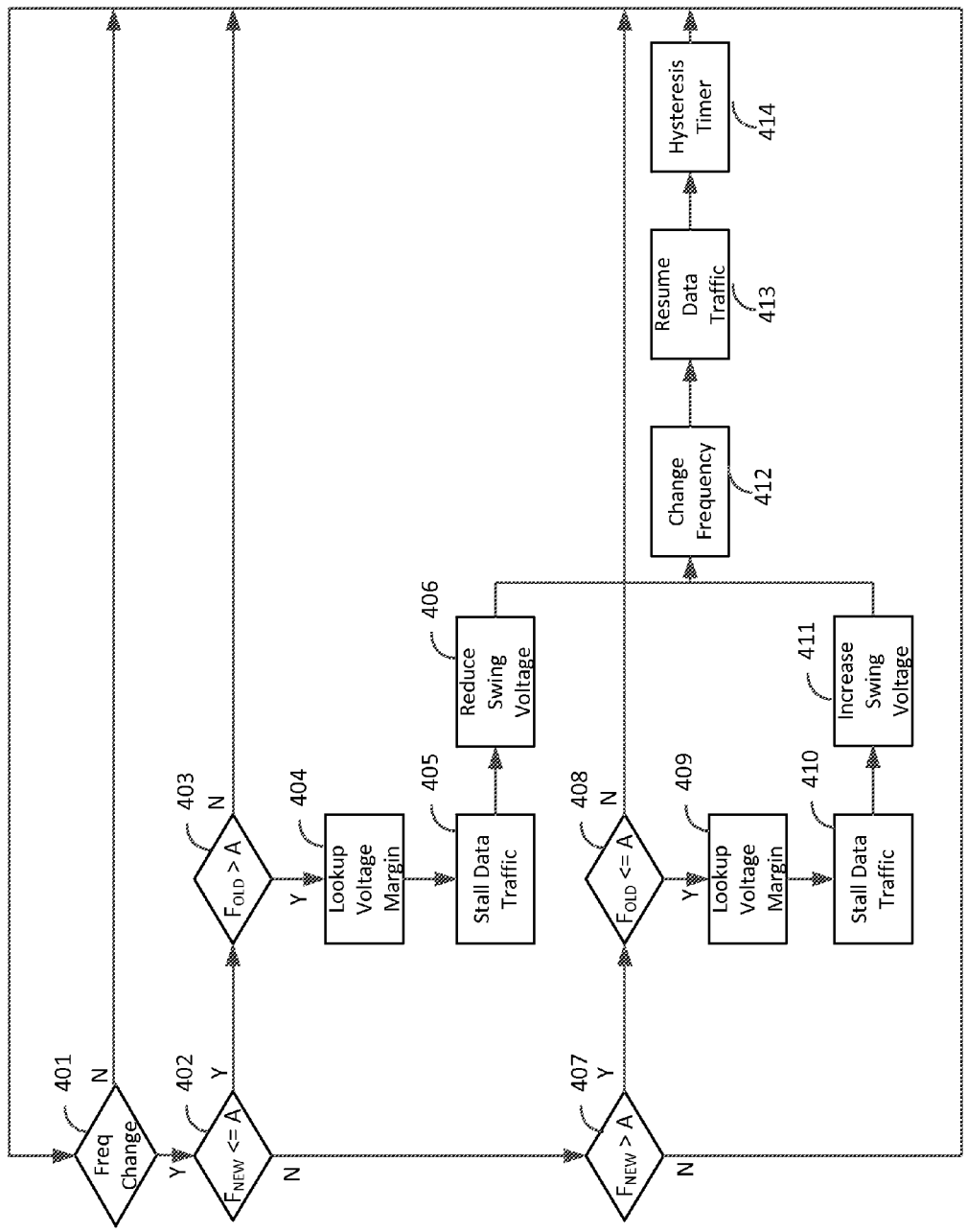
FIG. 4 is a flow diagram of an example process for adjusting a swing voltage of an I/O interface in response to a frequency change according to an embodiment of the present disclosure.

FIG. 4 is a flow diagram of an example process 400 for adjusting a swing voltage of an I/O interface (e.g., first I/O interface 210 or second I/O interface 211) in response to a frequency change according to an embodiment of the present disclosure. The example process 400 is provided merely as an example and additional or fewer steps may be performed in similar or alternative orders, or in parallel, within the scope of the various embodiments described in this specification. The process 400 may be performed by an I/O voltage controller (e.g., first I/O voltage controller 205 or second I/O voltage controller 206).

In step 401, a determination is made whether the frequency is to be changed to a new frequency. In one aspect, an indication that the frequency will be changed may be received by a device (e.g., memory controller) that controls the frequency. If a change in frequency is determined, then the process 400 proceeds to step 402. Otherwise, the process 400 returns in step 401.

In step 402, a determination is made whether the new frequency is lower than or equal to a frequency threshold (denoted "A"). The frequency threshold may relate to a frequency boundary where the change in frequency would necessitate a change in signal swing voltage. In some aspects, the frequency threshold corresponds to a frequency where the voltage margins begin to change by a significant amount across a range of frequencies contained in the lookup table. If the new frequency is lower than or equal to the frequency threshold, then the process 400 proceeds to step 403. Otherwise, the process 400 proceeds to step 407.

In step 403, a determination is made whether an old frequency is greater than the frequency threshold. The old frequency may be the frequency before the frequency change. If the old frequency is greater than the frequency threshold, then the process 400 proceeds to step 404. This may occur when the frequency change causes the frequency to cross below the frequency threshold. Otherwise, the process 400 returns to step 401.

In step 404, a voltage margin corresponding to the new frequency and current temperature is obtained from a lookup table (e.g., lookup table 300).

In step 405, data traffic is stalled. After the data traffic is stalled, the process 400 proceeds to step 406.

In step 406, the signal swing voltage is reduced based on the voltage margin obtained from the lookup table. The process 400 then proceeds to step 412, which is discussed further below.

In step 407, a determination is made whether the new frequency is greater than the frequency threshold. If the new frequency is determined to be greater than the frequency threshold, then the process 400 proceeds to step 408. Otherwise, the process returns to step 401.

In step 408, a determination is made whether the old frequency is lower than or equal to the frequency threshold. If the old frequency is determined to be lower than or equal to the frequency threshold, then the process 400 proceeds to step 409. This may occur when the frequency change causes the frequency to cross above the frequency threshold. Otherwise, the process 400 returns to step 401.

In step 409, a voltage margin corresponding to the new frequency and current temperature is obtained from a lookup table (e.g., lookup table 300).

In step 410, data traffic is stalled. After the data traffic is stalled, the process 400 proceeds to step 411.

In step 411, the signal swing voltage is increased based on the voltage margin obtained from the lookup table. The process 400 then proceeds to step 412.

In step 412, the frequency is changed to the new frequency and allowed to settle.

In step 413, data traffic is resumed after the signal swing voltage adjustment and the frequency has settled to the new frequency.

In step 414, the process 400 delays any command to decrease the frequency until a hysteresis timer has expired. The command may be from a device that controls the frequency (e.g., memory controller). As a result, the frequency does not immediately go down after the frequency change. This prevents the circuit that generates the frequency (e.g., phase locked loop (PLL) and frequency dividers) from constantly changing the frequency up and down. In some aspects, the hysteresis timer is not applied to a command to increase the frequency. This is because a long delay may starve a client (e.g., on the first device 201) that needs a higher frequency as soon as possible.

It is to be appreciated that the process 400 is not limited to one frequency threshold. For example, the process 400 may have a plurality of frequency thresholds where each threshold corresponds to a frequency boundary, as discussed above. In this example, when a frequency change is determined in step 401, the process 400 may determine whether the frequency change causes the frequency to cross below one or more of the frequency thresholds. If so, then the process may proceed to step 404. If not, then the process 400 may determine whether the frequency change causes the frequency to cross above one or more of the frequency thresholds. If so, then the process may proceed to step 409. Otherwise, the process 400 may return to step 401.

Figure 5:
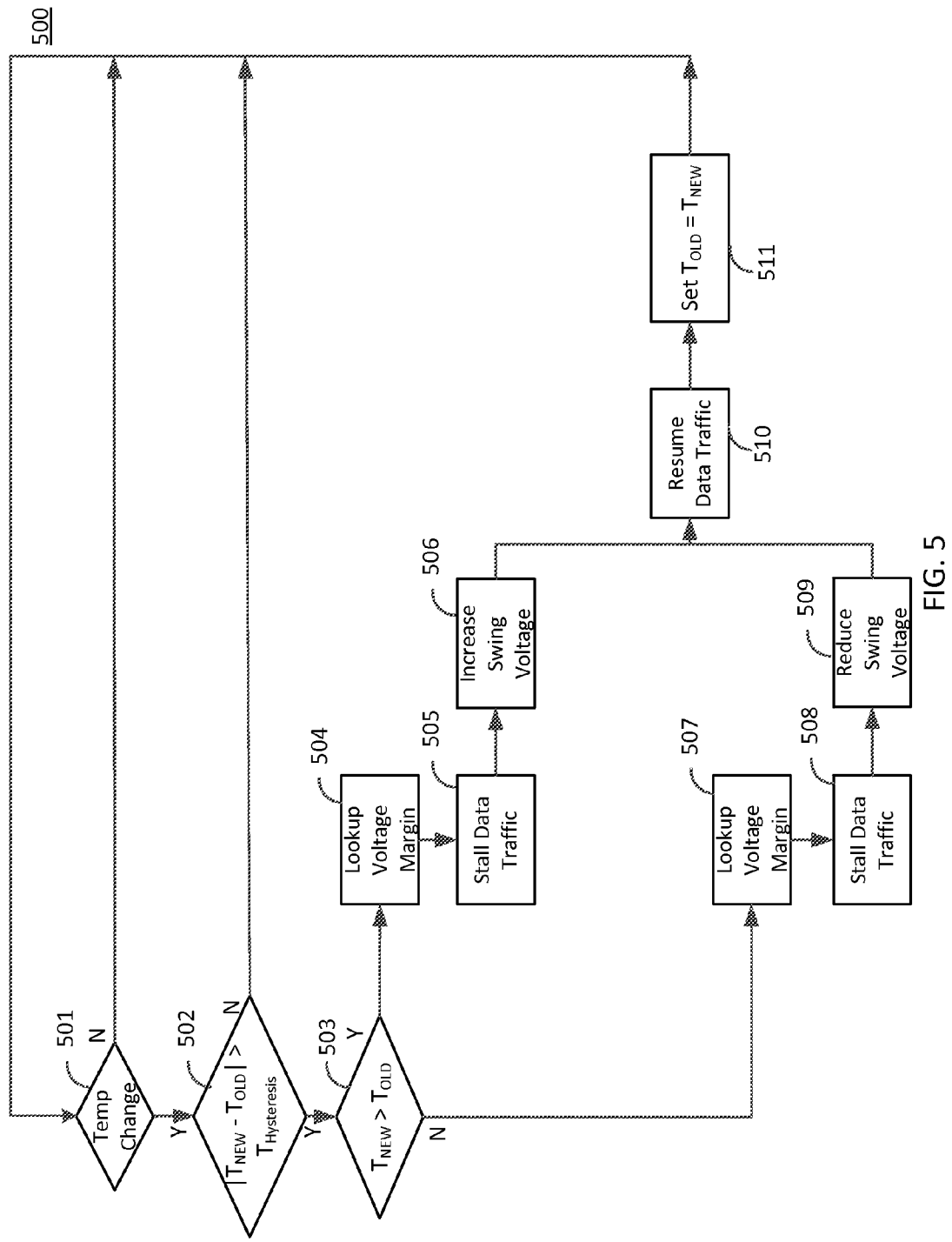
FIG. 5 is a flow diagram of an example process for adjusting a swing voltage of an I/O interface in response to a temperature change according to an embodiment of the present disclosure.

FIG. 5 is a flow diagram of an example process 500 for adjusting a swing voltage of an I/O interface (e.g., first I/O interface 210 or second I/O interface 211) in response to a temperature change according to an embodiment of the present disclosure. The example process 500 is provided merely as an example and additional or fewer steps may be performed in similar or alternative orders, or in parallel, within the scope of the various embodiments described in this specification. The process 500 may be performed by an I/O voltage controller (e.g., first I/O voltage controller 205 or second I/O voltage controller 206).

In step 501, a determination is made whether there is a change in temperature. A temperature change may be detected using a temperature sensor (e.g., first temperature sensor 215 or second temperature sensor 216). If a change in temperature is determined, then the process 500 proceeds to step 502. Otherwise, the process 500 returns to step 501.

In step 502, a determination is made whether an absolute difference between a new temperature and an old temperature is greater than a temperature threshold (denoted "$T_{Hysteresis}$"). The new temperature may be a current temperature from the temperature sensor and the old temperature may be the temperature at the last time the swing voltage was adjusted. If the absolute difference between the new temperature and the old temperature is greater than the temperature threshold, then the process 500 proceeds to step 503. Otherwise, the process 500 returns to step 501. The temperature threshold may be used to prevent the swing voltage from constantly changing due to small temperature fluctuations.

In step 503, a determination is made whether the new temperature is greater than the old temperature. If the new temperature is greater, then the process 500 proceeds to step 504. Otherwise, the process 500 proceeds to step 507.

In step 504, a voltage margin corresponding to the new temperature and current frequency is obtained from a lookup table (e.g., lookup table 300).

In step 505, data traffic is stalled. After the data traffic is stalled, the process 500 proceeds to step 506.

In step 506, the signal swing voltage is increased based on the voltage margin obtained from the lookup table.

The process 500 then proceeds to step 510, which is discussed further below.

In step 507, a voltage margin corresponding to the new temperature and current frequency is obtained from a lookup table (e.g., lookup table 300).

In step 508, data traffic is stalled. After the data traffic is stalled, the process 500 proceeds to step 509.

In step 509, the signal swing voltage is reduced based on the voltage margin obtained from the lookup table. The process 500 then proceeds to step 510.

In step 510, data traffic is resumed after the signal swing voltage adjustment.

In step 511, the old temperature is set equal to the new temperature, and the process 500 returns to step 501.

In some aspects, after the voltage margin corresponding to the new temperature is obtained from the lookup table in step 504, the process 500 may determine whether the voltage margin corresponding to the new temperature differs from the current voltage margin. If they differ, then the process 500 may proceed to step 505, as discussed above. If they are the same, then the process 500 may return to step 501. Similarly, after the voltage margin corresponding to the new temperature is obtained from the lookup table in step 507, the process 500 may determine whether the voltage margin corresponding to the new temperature differs from the current voltage margin. If they differ, then the process 500 may proceed to step 508, as discussed above. If they are the same, then the process 500 may return to step 501.

Figure 6:
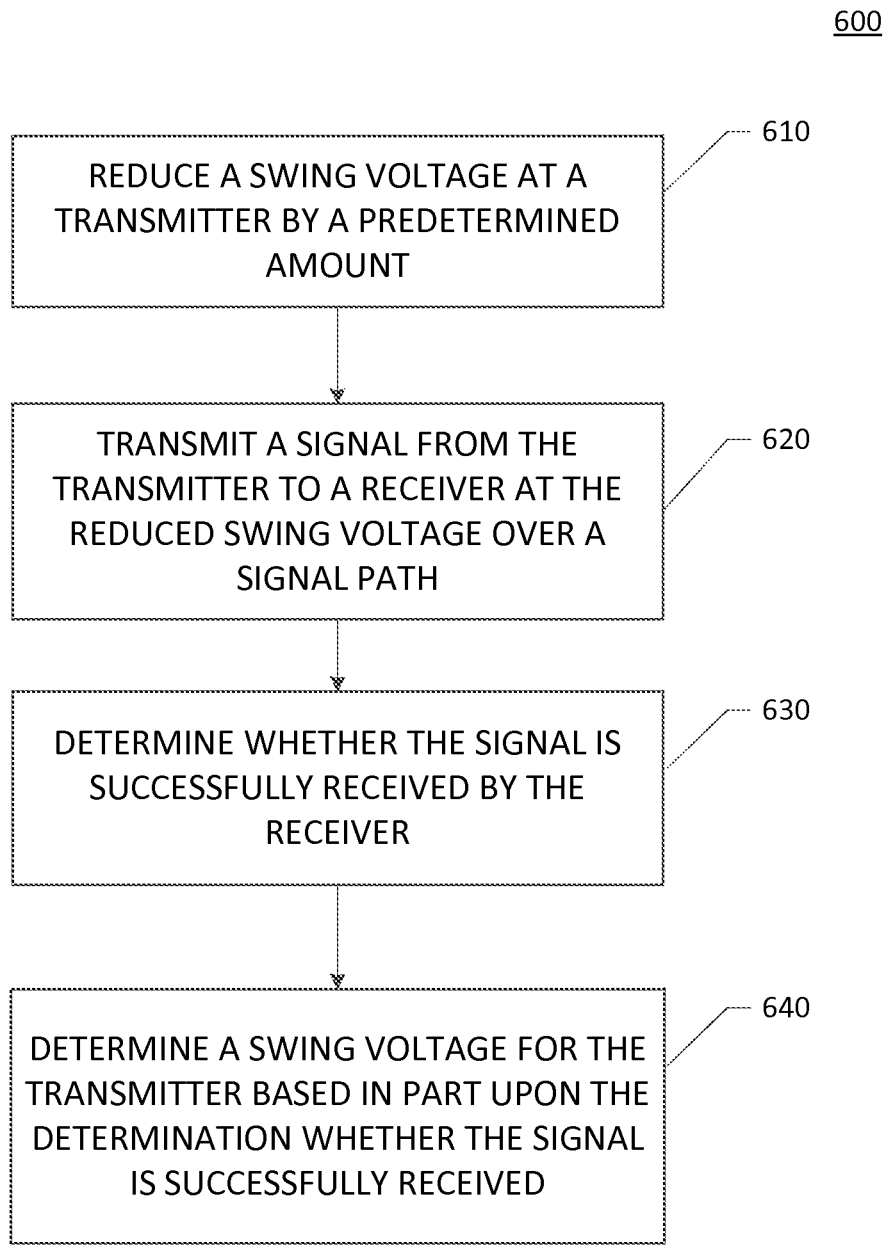
FIG. 6 is a flow diagram of an example process of determining a swing voltage according to an embodiment of the present disclosure.

FIG. 6 is a flow diagram of an example process 600 for determining a swing voltage according to an embodiment of the present disclosure. The example process 600 is provided merely as an example and additional or fewer steps may be performed in similar or alternative orders, or in parallel, within the scope of the various embodiments described in this specification. The process 600 may be performed by an I/O voltage controller (e.g., first I/O voltage controller 205 and/or second I/O voltage controller 206).

In step 610, a swing voltage at a transmitter is reduced by a predetermined amount. For example, the swing voltage at the transmitter (e.g., transmitter 220 or transmitter 230) may be reduced from a swing voltage defined in a specification.

In step 620, a signal is transmitted from the transmitter to a receiver at the reduced swing voltage over a signal path. For example, the transmitter and the receiver (e.g., receiver 221 or receiver 231) may be located on separate chips, and the signal may be transmitted over the signal path (e.g., traces on a PCB), wherein the signal path provides inter-chip communication between the transmitter and receiver.

In step 630, a determination is made whether the signal is successfully received by the receiver. For example, the signal transmitted to the receiver may comprise a predetermined data pattern. In this example, a determination may be made that the signal is successfully transmitted if the pattern received by the receiver matches the transmitted pattern.

In step 640, a swing voltage for the transmitter is determined based at least in part upon the determination whether the signal is successfully received. For example, if the signal is successfully received at the reduced swing voltage, then the swing voltage for the transmitter may be set to the reduced swing voltage for subsequent data transmissions. For the example in which the swing voltage is reduced from a swing voltage defined in the specification, using the reduced swing voltage reduces power consumption by the transmitter compared with using the swing voltage defined in the specification.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

For example, each of the I/O voltage controllers 205 and 206 may comprise a processor configured to perform one or more of the functions described above. As used herein, the term "processor" comprises, but is not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale in order to optimize space usage or enhance performance of user equipment. A processor may also be implemented as a combination of computing devices, e.g., a combination of a DSP and a microprocessor, a plurality of microprocessors, one or more microprocessors in conjunction with a DSP core, or any other such configuration.

Furthermore, in the subject specification, the term "memory" refers to data stores, algorithm stores, and other information stores such as, but not limited to, image store, digital music and video store, charts and databases. It will be appreciated that the memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. A number of different types of memories and memory technologies are available or contemplated in the future, all of which are suitable for use with the various aspects. Such memory technologies/types include synchronous RAM (SDRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM), phase change memory (PRAM), non-volatile random-access memory (NVRAM), pseudostatic random-access memory (PSDRAM), and other random-access memory (RAM) and read-only memory (ROM) technologies known in the art. Additionally, the disclosed memory components of systems and/or methods herein are intended to comprise, without being limited to, these and any other suitable types of memory.

Each of the above-mentioned memory technologies include, for example, elements suitable for storing instructions, programs, control signals, and/or data for use in or by a computer or other digital electronic device. Any references to terminology and/or technical details related to an individual type of memory, interface, standard or memory technology are for illustrative purposes only, and not intended to limit the scope of the claims to a particular memory system or technology unless specifically recited in the claim language.

For a software implementation, the techniques described herein may be implemented with modules (e.g., procedures, functions, and so on) that perform the functions described herein. The software codes or code instructions may be stored in memory units, or memories computer-readable media, and executed by processors. A memory unit, or memory, may be implemented within the processor or external to the processor, in which case it can be communicatively coupled to the processor via various conventional means.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and blu-ray disc where discs reproduce data optically with lasers. Combinations of the above should also be included within the scope of computer-readable media.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the terms "includes," "including," "possess," and possessing," or "has" and "having" are used in the subject specification, such terms are intended to be inclusive in a manner similar to the term "comprising" as "comprising" is interpreted when employed as a transitional word in a claim.

What is claimed is:

1. A device, comprising:
an input/output (I/O) interface; and
an I/O voltage controller configured to determine a frequency or temperature of the I/O interface, and to adjust a swing voltage of the I/O interface based at least in part upon the determined frequency or temperature of the I/O interface;
wherein the I/O interface is configured to stall data traffic during the swing voltage adjustment, and to resume the data traffic after the swing voltage adjustment.

2. The device of claim 1, wherein the I/O voltage controller is configured to obtain a voltage margin corresponding to the determined frequency or temperature, and to adjust the swing voltage of the I/O interface based on the voltage margin.

3. The device of claim 2, further comprising memory storing a lookup table, wherein the lookup table comprises a plurality of voltage margins, each of the voltage margins corresponding to a different temperature-frequency pair, wherein the I/O voltage controller is configured to obtain the voltage margin from the lookup table.

4. A device, comprising:
an input/output (I/O) interface; and
an I/O voltage controller configured to determine a frequency or temperature of the I/O interface, to obtain a voltage margin corresponding to the determined frequency or temperature, and to adjust the swing voltage of the I/O interface based on the voltage margin, wherein the voltage margin represents an amount by which the swing voltage of the I/O interface is lower than a predetermined swing voltage.

5. A device, comprising:
an input/output (I/O) interface;
a temperature sensor configured to sense a temperature of the I/O interface and to generate a temperature reading based on the sensed temperature; and
an I/O voltage controller configured to detect the temperature of the I/O interface based on the temperature reading, and to adjust a swing voltage of the I/O interface based at least in part upon the detected temperature of the I/O interface.

6. A device, comprising:
an input/output (I/O) interface, wherein the I/O interface receives a supply voltage from a power supply; and
an I/O voltage controller configured to determine a frequency or temperature of the I/O interface, to adjust a swing voltage of the I/O interface based at least in part upon the determined frequency or temperature of the I/O interface, and to adjust the supply voltage of the power supply based at least in part upon the swing voltage of the I/O interface.

7. The device of claim 1, wherein the I/O interface is configured to transmit a signal to a second device over a signal path.

8. The device of claim 7, wherein the device and the second device are on separate chips.

9. A method for swing voltage determination, comprising:
reducing a swing voltage at a transmitter by a predetermined amount;
transmitting a signal from the transmitter to a receiver at the reduced swing voltage over a signal path;
determining whether the signal is successfully received by the receiver; and
determining a swing voltage for the transmitter based at least in part upon the determination of whether the signal is successfully received, wherein the determined swing voltage accounts for impedances of the signal path, frequency responses of the signal path, or dimensions of the signal path.

10. The method of claim 9, wherein the signal path comprises one or more traces on a board, one or more package connections, or one or more board connectors.

11. The method of claim 10, wherein the transmitter and the receiver are on separate chips.

12. The method of claim 9, wherein the signal comprises a data pattern, and wherein determining whether the signal is successfully received by the receiver comprises comparing the data pattern received by the receiver against a copy of the data pattern at the receiver.

13. The method of claim 9, wherein the signal comprises a data pattern, and wherein determining whether the signal is successfully received by the receiver comprises comparing the data pattern received by the receiver against the data pattern transmitted by the transmitter.

14. The method of claim 9, wherein the signal comprises a data portion and an error-detection portion, and wherein determining whether the signal is successfully received by the receiver comprises calculating an error-detection portion from the data portion received by the receiver, and comparing the calculated error-detection portion with the error-detection portion received by the receiver.

15. The method of claim 9, further comprising repeating the reducing step and the transmitting step until the signal is not successfully received by the receiver, and wherein determining the swing voltage for the transmitter is based at least in part upon one of the reduced swing voltages at which the signal is successfully received by the receiver.

16. The method of claim 15, wherein determining the swing voltage for the transmitter is based at least in part upon a lowest one of the reduced swing voltages at which the signal is successfully received by the receiver.

17. The method of claim 9, further comprising:
determining a frequency at which the signal is transmitted; and
storing a voltage margin corresponding to the determined swing voltage in a lookup table, wherein the voltage margin is associated with the frequency in the lookup table.

18. The method of claim 9, further comprising:
detecting a temperature at which the signal is transmitted; and storing a voltage margin corresponding to the determined swing voltage in a lookup table, wherein the voltage margin is associated with the temperature in the lookup table.

19. A device, comprising:
an input/output (I/O) interface;
means for determining a frequency or temperature of the I/O interface;
means for adjusting a swing voltage of the I/O interface based at least in part upon the determined frequency or temperature of the I/O interface;
means for stalling data traffic during the swing voltage adjustment; and
means for resuming the data traffic after the swing voltage adjustment.

20. The device of claim 19, further comprising:
means for obtaining a voltage margin corresponding to the determined frequency or temperature; and
means for adjusting the swing voltage of the I/O interface based on the voltage margin.

21. The device of claim 20, further comprising means for storing a lookup table, wherein the lookup table comprises a plurality of voltage margins, each of the voltage margins corresponding to a different temperature-frequency pair, wherein the means for obtaining the voltage margin comprises means for obtaining the voltage margin from the lookup table.

22. A device, comprising:
an input/output (I/O) interface;
means for determining a frequency or temperature of the I/O interface;
means for obtaining a voltage margin corresponding to the determined frequency or temperature of the I/O interface; and
means for adjusting a swing voltage of the I/O interface based on the voltage margin, wherein the voltage margin represents an amount by which the swing voltage of the I/O interface is lower than a predetermined swing voltage.

23. A device, comprising:
an input/output (I/O) interface;
means for sensing a temperature of the I/O interface;
means for generating a temperature reading based on the sensed temperature;
means for detecting the temperature of the I/O interface based on the temperature reading; and
means for adjusting a swing voltage of the I/O interface based at least in part upon the detected temperature of the I/O interface.

24. A device, comprising:
an input/output (I/O) interface;
means for providing a supply voltage to the I/O interface from a power supply;
means for determining a frequency or temperature of the I/O interface;
means for adjusting a swing voltage of the I/O interface based at least in part upon the determined frequency or temperature of the I/O interface; and
means for adjusting the supply voltage of the power supply based at least in part upon the swing voltage of the I/O interface.

25. The device of claim 19, wherein the I/O interface comprises means for transmitting a signal to a second device over a signal path.

26. The device of claim 25, wherein the device and the second device are on separate chips.

27. The device of claim 1, wherein the I/O interface comprises a transmitter having an output coupled to a second device via a signal path and configured to transmit a signal from the output of the transmitter to the second device over the signal path, and wherein the swing voltage of the I/O interface is a swing voltage at the output of the transmitter.

28. The device of claim 27, wherein the frequency of the I/O interface is a frequency of the signal, and the I/O voltage controller is configured to adjust the swing voltage at the output of the transmitter based at least in part upon the frequency of the signal.

29. The device of claim 27, wherein the I/O voltage controller is configured to determine the temperature of the I/O interface based on a temperature reading from a temperature sensor, and to adjust the swing voltage at the output of the transmitter based at least in part upon the determined temperature.

30. The device of claim 27, wherein the signal path comprises one or more traces on a board, one or more package connections, or one or more board connectors.

* * * * *